United States Patent
Posey

(10) Patent No.: US 7,427,435 B2
(45) Date of Patent: Sep. 23, 2008

(54) COATING COMPOSITION FOR ADHERING METALLIZED LAYERS TO POLYMERIC FILMS

(75) Inventor: Robert Giles Posey, Duncan, SC (US)

(73) Assignee: Mitsubishi Polyester Film, Inc., Greer, SC (US)

( * ) Notice: Subject to any disclaimer, the term of this patent is extended or adjusted under 35 U.S.C. 154(b) by 0 days.

(21) Appl. No.: 11/493,867

(22) Filed: Jul. 26, 2006

(65) Prior Publication Data

US 2007/0031656 A1    Feb. 8, 2007

Related U.S. Application Data

(60) Provisional application No. 60/702,458, filed on Jul. 26, 2005.

(51) Int. Cl.
  B32B 7/02    (2006.01)
  B32B 7/12    (2006.01)
  B32B 15/08   (2006.01)
  B32B 15/09   (2006.01)
  B32B 27/36   (2006.01)

(52) U.S. Cl. ............ 428/195.1; 428/35.8; 428/201; 428/203; 428/204; 428/206; 428/209; 428/210; 428/336; 428/339; 428/446; 428/458; 428/469; 428/480; 427/585; 427/123; 427/124; 427/126.1; 427/126.3; 427/419.1; 427/419.2

(58) Field of Classification Search ............ None
See application file for complete search history.

(56) References Cited

U.S. PATENT DOCUMENTS

| | | | |
|---|---|---|---|
| 4,299,933 A | 11/1981 | McConnell et al. | |
| 4,304,901 A | 12/1981 | O'Neil et al. | |
| 4,436,896 A * | 3/1984 | Okamoto et al. | 156/332 |
| 4,493,872 A * | 1/1985 | Funderburk et al. | 428/332 |
| 4,598,142 A | 7/1986 | Hilbert et al. | |
| 4,971,863 A * | 11/1990 | Hart | 428/458 |
| 4,990,486 A * | 2/1991 | Kamosaki et al. | 503/227 |
| 5,164,248 A * | 11/1992 | Fleury et al. | 428/220 |
| 5,349,010 A * | 9/1994 | Kuo | 524/600 |
| 5,605,764 A | 2/1997 | Miller et al. | |
| 5,750,605 A * | 5/1998 | Blumenthal et al. | 524/230 |
| 5,753,589 A * | 5/1998 | Takao et al. | 503/227 |
| 5,869,567 A * | 2/1999 | Fujita et al. | 524/608 |
| 6,428,900 B1 * | 8/2002 | Wang | 428/481 |
| 6,458,467 B1 * | 10/2002 | Mizuno et al. | 428/480 |
| 6,482,501 B2 * | 11/2002 | Mizuno et al. | 428/141 |
| 6,521,679 B1 * | 2/2003 | Okada et al. | 523/336 |
| 6,543,208 B1 * | 4/2003 | Kobayashi et al. | 53/452 |
| 6,607,823 B2 * | 8/2003 | Posey et al. | 428/336 |
| 6,653,522 B1 * | 11/2003 | Blumenthal et al. | 604/361 |
| 6,692,879 B2 * | 2/2004 | Suzuki et al. | 430/17 |
| 6,733,863 B1 * | 5/2004 | Mizuno et al. | 428/143 |
| 6,743,512 B2 * | 6/2004 | Murata et al. | 428/423.1 |
| 6,835,269 B1 | 12/2004 | Miharu et al. | |
| 7,008,698 B2 * | 3/2006 | Marlow et al. | 428/480 |
| 7,173,100 B2 * | 2/2007 | Mitsuyasu et al. | 528/272 |

FOREIGN PATENT DOCUMENTS

| | | | |
|---|---|---|---|
| EP | 0397484 A2 | | 5/1990 |
| GB | 1078813 | | 2/1968 |
| JP | 05-084863 | * | 4/1993 |
| JP | 2002-302663 | * | 10/2002 |
| WO | WO 9619333 | | 6/1996 |
| WO | WO 9637569 | | 11/1996 |
| WO | WO 0136113 A2 | | 5/2001 |
| WO | WO 0154886 A1 | | 8/2001 |

OTHER PUBLICATIONS

Product Information Sheet—CMP Celplast Metallized Products Limited, Revised Jul. 12, 2005, 3 pages, hppt://cmp.cleplast.com/testing_capabilities.htm.
German Abstract for WO 01/53080, Amorphous, heat-sealable, UV-stable, flame-retardant, thermoformable, co-extruded polyester film which is matt on one side, a method for the production thereof and the use of the same, Jul. 26, 2001.
Japanese Abstract for JP2005113020, Resin Composition for Adhesives, Apr. 28, 2005.
Japanese Abstract for JP2004346131, Polyester Resin and Composition, Dec. 9, 2004.
Japanese Abstract for JP2006037014, Coating Composition, Feb. 9, 2006.

* cited by examiner

*Primary Examiner*—Vivian Chen
(74) *Attorney, Agent, or Firm*—Dority & Manning, P.A.

(57) ABSTRACT

A metallized film and a process for making the film are disclosed. In general, the metallized film includes a polymeric film layer that is coated with a polyester coating composition. A metal layer is then formed on top of the polyester coating. The polyester coating acts as a tie layer between the metal layer and the underlying film. The polyester film composition may be formed from, in one embodiment, isophthalic acid, a sulfomonomer, and 2-methyl 1,3-propane diol. The above diol has been found to improve adhesion between the metal layer and the polymeric film layer.

27 Claims, No Drawings

COATING COMPOSITION FOR ADHERING METALLIZED LAYERS TO POLYMERIC FILMS

RELATED APPLICATIONS

The present application is based upon and claims priority to U.S. Provisional Patent Application Ser. No. 60/702,458 filed on Jul. 26, 2005.

BACKGROUND OF THE INVENTION

Polymer films are perhaps one of the most common materials used for packaging. The films may be used, for instance, to package products such as various articles of manufacture and food items. Food items that are packaged by polymer films, for instance, include not only solid foods, but liquids such as drinks as well.

In some applications, the polymer film is coated with a metal in order to form a laminate that may be used as a packaging material or may be used in various other applications. For instance, metallized polymer films are also used as labels, decals, solar window films, decorative products, and microfilm in addition to being used in packaging applications. Of particular advantage, polymer films coated with a metallic layer prevent the passage of visible and ultraviolet light, which may serve to prevent oxidative degradation of a product covered by the film laminate.

In one particular embodiment, the metal layer is coated on a polyester film. When containing a metal layer, the polyester film provides a strong and flexible packaging material with desirable oxygen and moisture barrier properties in addition to having visible and ultraviolet light barrier properties. Of particular advantage, the metal coated polyester film is typically much less expensive to manufacture and use in packaging structures than conventional metallic foil.

In view of the above, those skilled in the art have attempted to devise various processes for bonding metal layers to polymer films, such as polyester films. For example, U.S. Pat. No. 4,493,872 to Funderburk, Culbertson and Posey discloses a polyester film coated with a copolyester that is designed to improve bonding between a metal layer and the polyester film. The processes and products disclosed in the '872 patent, which is incorporated herein by reference, have represented great advancements in the art. In fact, products made according to the '872 patent have experienced significant commercial success. For instance, metallized polyester films made according to the '872 patent are used to package many consumer products, such as many fruit beverage drink pouches.

The present disclosure is directed to further improvements in polymer film laminates that contain a metal or metal oxide layer. In particular, the present inventor (who is also listed as a co-inventor on the '872 patent) has discovered a specific copolyester film coating that further improves bonding between a polymer film layer and a metal layer.

SUMMARY OF THE INVENTION

As described above, the present disclosure is generally directed to polymer films containing a metal or metal oxide layer and to a process for producing the film laminates. More particularly, the present disclosure is directed to a coating composition that has been found to improve bonding between a metal layer and a polymer film layer.

For example, in one embodiment, the present disclosure is directed to a metallized film comprising a polymeric film substrate having a first side and a second side. The polymeric film substrate may comprise, for instance, a polyester film, such as a polyethylene terephthalate (PET) film. In an alternative embodiment, the film substrate may comprise a polyamide or nylon film.

In accordance with the present disclosure, at least one side of the film substrate is coated with a polyester coating. The polyester coating comprises a polyester formed from a phthalic acid and a diol. Specifically, the diol comprises 2-methyl 1,3-propane diol.

The metallized film further includes a metal or metal oxide layer adhered to the polyester coating.

The polyester coating as described above has been found to improve adhesion between the metal layer and the film substrate. As described above, the polyester coating contains 2-methyl 1,3-propane diol, which has been found to provide unexpected benefits and advantages in comparison to other diols, such as glycols, that have been used in prior metallized film laminates.

In one embodiment, the polyester coating comprises a copolyester. The copolyester is formed from isophthalic acid, a sulfomonomer containing a sulfonate group attached to a dicarboxylic nucleus in addition to 2-methyl 1,3-propane diol. The sulfomoner may be, for instance, a sodium salt of 5-sulfoisophthalic acid. The mole ratio of the sodium salt to the isophthalic acid in this embodiment may be, for instance, from about 8:92 to about 12:88, such as about 10:90.

The metal or metal oxide layer adhered to the polyester coating can comprise any suitable metal or metal oxide as desired. In one embodiment, for instance, the metal layer comprises aluminum. In other embodiments, however, the metal layer may comprise zinc, nickel, silver, copper, gold, indium, tin, stainless steel, chromium, titanium and metal oxides thereof.

Of particular advantage, the polyester coating of the present disclosure has been found to significantly improve the bonding of the metal or metal oxide layer to the polymeric film substrate. For example, in one embodiment, the metal or metal oxide layer may have a peel strength of greater than about 1000 g/in, such as greater than about 1300 g/in, when the polyester coating is present in between the metal or metal oxide layer and a film substrate.

The polyester coating of the present disclosure has also been found to display very good ink adhesion properties. For instance, the film substrate may have an ink adhesion of greater than about 300 g/in, such as greater than about 400 g/in.

Other features and advantages of the present disclosure are discussed in greater detail below.

DETAILED DESCRIPTION

It is to be understood by one of ordinary skill in the art that the present discussion is a description of exemplary embodiments only, and is not intended as limiting the broader aspects of the present disclosure.

In general, the present disclosure is directed to metallized polymer films and to a process for producing the films. More particularly, the present disclosure is directed to a coating composition or tie layer that more securely attaches a metal or metal oxide layer to a polymeric film substrate. For example, in one particular embodiment, the coating composition may be used to adhere an aluminum layer to a polyester or polyamide film.

In one embodiment, the coating composition contains a polyester, such as a copolyester. The polyester coating may be formed, for instance, from a phthalic acid, such as isophthalic acid, a sulfomonomer, and a diol. In accordance with the present disclosure, the diol comprises 2-methyl 1,3-propane diol. The present inventor has discovered that 2-methyl 1,3-propane diol provides various advantages and benefits not realized in the past when used in a metallized film laminates.

In the past, similar polyester coatings have been disclosed such as those described in U.S. Pat. No. 4,493,872. In the '872 patent, however, instead of using a propane diol, the '872 patent teaches the use of at least one aliphatic or cycloaliphatic alkylene glycol having from about 2 to 11 carbon atoms. Although the coatings disclosed in the '872 patent have shown to improve the bonding characteristics between a metal layer and a plastic film base, the present disclosure is directed to further improvements in metallized films.

Polyester coatings for polymer films, such as PET films, are also disclosed in U.S. Pat. No. 6,607,823, which is also incorporated herein by reference. In the '823 patent, 1,3-propane diol is used in forming a copolyester coating. The copolyester coating is described as a heat seal coating that provides a durable, strong, moisture resistant heat seal when applied to a base film. The present inventor surprisingly found that another propane diol, namely 2-methyl 1,3-propane diol, is well suited for vacuum metallization applications and provides excellent peel strength when the coating composition is applied in between a base film and a metal or metal oxide layer. Further, the coating composition has been found to provide good ink adhesion properties.

The use of 2-methyl 1,3-propane diol provides various other advantages in relation to the use of a 1,3-propane diol. For example, in addition to being better suited to bonding metal and metal oxide layers to polymeric films, 2-methyl 1,3-propane diol is easier to process when producing the polyester coating. For example, 1,3-propane diol may give off an allyl alcohol and acrolein during synthesis of the copolyester, which may require careful handling of the material as the copolyester is being formed.

As described above, the polyester coating composition of the present disclosure generally contains a phthalic acid, such as isophthalic acid. In addition to isophthalic acid, other aromatic difunctional monomers may be used. Such monomers include DMT, DM-2,6-NDC, and the like.

In addition, the composition may contain a sulfomonomer. Examples of sulfomonomers may be generally represented by the following formula:

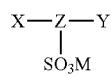

wherein,

M is a monovalent caption of an alkali metal;

Z is a trivalent aromatic radical; and

X and Y are carboxyl groups or polyester forming equivalents.

In one embodiment, the sulfomonomer can contain an alkali metal sulfonate group attached to a dicarboxylic aromatic nucleus. Optionally, an aliphatic dicarboxylic acid of the formula $HOOC(CH_2)\text{---}_nCOOH$, wherein n is about 1 to about 11 can also be employed as the monomer used herein.

Examples of dicarboxylic acids suitable for use in the present disclosure include malonic, adipic, azelaic, glutaric, sebacic, suberic, succinic, brassylic acids and mixtures thereof.

In one embodiment, for instance, the sulfomonomer comprises a sodium salt of 5-sulfoisophthalic acid. The isophthalic acid may have a mole ratio to the sulfomonomer of from about 88:12 to about 92:8, such as from about 89.5:10.5 to about 90.5:9.5. For example, in one embodiment, the mole ratio between the isophthalic acid and the sulfomononer may be about 90:10.

The 2-methyl 1,3-propane diol, on the other hand, may be present in the composition in stoiciometric amounts in relation to the isophthalic acid and sulfomonomer. For example, in relation to the isophthalic acid and the sulfomonomer, the 2-methyl 1,3-propane diol may be present in the composition in amounts of about 100 mole percent or greater.

The polyester coating may be prepared by well known polymerization techniques. In one embodiment, for instance, the coating composition can be formulated by simply combining the desired coating components. In one particular embodiment, the acid components are mixed with the diol and heated optionally in the presence of a catalyst in order to cause a polycondensation reaction.

The polyester coating composition may be characterized as having an acid number of less than 10, such as from about 0 to about 3. The polyester can also have a number average molecular weight of less than about 50,000 and a relative viscosity (a 1% solution in dichloroacetic acid at 25° C. using an Ubbelohde Capillary Viscometer within the range of from about 30 to about 700, such as from about 350 to about 650.

The polyester coating may be applied to a polymeric film as an aqueous dispersion. The polyester or copolyester formed may, in one embodiment, be water dispersible. The aqueous dispersion may have a solids content of up to about 11 weight percent, although in other applications it may be higher. In one embodiment, the solids level in the dispersion may be from about 2% to about 6%, such as at about 4%.

The coating composition can be applied to a polymeric film substrate at relatively low levels. For instance, the add-on to the film can be less than about 5000 ppm, such as less than about 1000 ppm, such as from about 300 ppm to about 400 ppm. The final coating thickness once dried may depend upon various factors. In general, however, the coating thickness may be less than about 1 micron, such as less than about 0.5 microns, such as less than about 0.3 microns. In one embodiment, for instance, the coating thickness may be less than about 500 angstroms, such as less than about 200 angstroms.

Conventional additives can be added to the coating composition. For example, pigments, other colorants, stabilizers, antistatic agents, adhesion promoters, antioxidants, delusterants, fillers, plasticizers, slip agents, and the like may be included as long as the additive does not interfere with the ability of the coating composition to bind a metal or metal oxide layer to the base polymer film.

Further, in addition to being placed in an aqueous dispersion when applied to a polymeric film, the polyester composition may also be combined with one or more alcohols when being applied.

The coating composition may be applied to one or both sides of the polymeric film. In general, the coating composition may be applied to any suitable polymeric film capable of acting as a substrate for a metal or metal oxide layer. Polymeric films that may be used include polyester films, such as PET films. Other polymeric films include polyamide films such as nylon films, polyolefin films, such as polypropylene, polyethylene and copolymers thereof, polyacetal films, polycarbonate films, and the like.

In one particular embodiment, the coating composition is used as a tie layer between a metal or metal oxide layer and a polyester film. The polyester film may be, for instance, polyethylene terephthalate, polyethylene naphthalate or polybutylene terephthalate. Copolyester films may also be used such as polyethylene terephthalate isophthalate. Generally, any polyester film based on a polymer resulting from polycondensation of a glycol or diol with a dicarboxylic acid (or its ester equivalents) such as terephthalic acid, isophthalic acid, sebacic acid, malonic, adipic, azelaic, glutaric, suberic, succinic acids and the like, or mixtures of two or more of the foregoing, are preferred for use in the present disclosure. Suitable glycols include ethylene glycol, diethylene glycol, polyethylene glycol, and polyols such as butanediol and the like. Mixtures of two or more of the foregoing are also suitable.

Any of the above base polymer films can contain conventional additives such as antioxidants, delusterants, pigments, fillers such as silica, calcium carbonate, kaolin, titanium dioxide, antistatic agents and the like, or mixtures thereof, all of which are well known in the art.

In addition, the base polymer film may be a polymer laminate. Such laminates include polymer-polymer laminates like polyester-polyolefin or polyester-adhesive-polyolefin, polymer-metallic laminates such as polyester-aluminum, or polymer-paper or polymer-adhesive-paper laminates. Coated polymer films or film laminates can also be used. Primer coatings used to enhance wet-out or coating adhesion are examples of such coatings.

The films may be produced by any well known technique in the art. For example, polyester is typically melted and extruded as an amorphous sheet onto a polished revolving casting drum to form a cast sheet of the polymer. The sheet is quickly cooled and then stretch oriented in one or more directions to impart strength and toughness to the film. The sheet is typically stretched from about two to about four times the original cast sheet dimension, in one or both directions. Biaxial orientation is most preferred, with monoaxial orientation being less preferred. Generally, stretching occurs in a temperature range from about the second order transition temperature of the polymer to below the temperature at which the polymer softens and melts. Where necessary, the film is heat treated after stretching to "lock-in" the properties by further crystallizing the film. The crystallization imparts stability and good tensile properties to the film. Such heat treatment for polyester film is generally conducted at about 190° C. to about 240° C.

The manner in which the coating composition is applied to the polymer film may also vary depending upon the particular circumstances. In one particular embodiment, for instance, the base polymer layer may be coated according to an inline process in which the coating is applied during the film manufacturing process and before the film is heat-set. Typically, the base polymer film may be coated after corona treatment and prior to a stretch orientation of the film. Alternatively, the film may be coated between drawing steps.

In addition to in-line coating, the polymeric film may also be coated in an off-line process. Thus, the coating and method of the present disclosure are also intended for use where, for example, the base polymer film is produced and later coated off-line with one or more coatings of the present disclosure. Alternatively, one or more coatings can be applied in-line, with the remainder being applied off-line. Conventional off-line coating processes include roll coating, reverse roll coating, gravure roll coating, reverse gravure roll coating, brush coating, wire-wound rod (Meyer rod) coating, spray coating, air knife coating, meniscus coating or dipping.

While surface modification of the base polymer film prior to coating is not required, it has been found that better results are obtained if the surface or surfaces of the base polymer film are modified before application of the coatings of the present disclosure. Conventional surface modification techniques include corona treatment, which is the most common and most preferred procedure for modifying the surface of the polymer base film to enhance coating adhesion. The corona treatment or other surface modification should be sufficient to permit wetting out of the coating. Corona treatment of about 1.0 watt per square foot per minute is typically sufficient to achieve the desired results. In addition, primer or other intermediate layers can optionally be used between the polymer film and the heat seal coating.

In one particular embodiment of the present disclosure, especially when coating polyester films, the polymer film material is first melted and extruded as an amorphous sheet onto a polished revolving casting drum to form a cast sheet of the polymer. Thereafter, the film is axially stretched in one direction, either in the direction of extrusion (longitudinal), or perpendicular to the direction of extrusion (transverse) in the case of monoaxially oriented film, and in two directions in the case of biaxially oriented film, that is, the film is stretched in both the longitudinal and transverse directions. The first stretching step of the cast sheet may be in either of these two orthogonal directions. The amount of stretching, to impart strength and toughness to the film, can range from about 3.0 to about 5.0 times the original cast sheet dimension in one or both directions. Preferably, the amount of stretching is in the range of between about 3.2 and 4.2 times the original dimension. The stretching operations are carried out at temperatures in the range of from about the second order transition temperature to below the temperature at which the polymer softens and melts.

Where necessary, the film is heat treated, after stretching, for a period of time necessary to crystallize the polyester film. Crystallization imparts stability and good tensile properties of the film. When polyethylene terephthalate is heat treated, it is subjected to a temperature in the range of between about 190° C. and 240° C. and, more preferably, in the range of between about 215° C. and 235° C.

The coating composition of the present disclosure, in this embodiment, may be applied prior to the stretching operation or during the stretching operation. Normally the heat applied to the film during the stretching or final conditioning stages is sufficient to evaporate off the water and other volatiles in the coating composition and dry the coating.

In still another embodiment, the coating composition may be applied after the film is uniaxially stretched but before the film is stretched in an orthogonal direction.

Once the coating composition is applied to the polymeric film and dried, a metal layer or metal oxide layer is formed on the dried coating. The metal or metal oxide layer may be formed, for instance, according to a vacuum deposition process. In this type of process, a stream of metal vapor or atoms are deposited onto the dried coating by vacuum deposition. This is effected by heating the metal in a high vacuum, preferably in the range of $10^{-3}$ to about $10^{-5}$ torr, to a temperature above the melting point of the metal such that the vapor pressure of the metal exceeds about $10^{-2}$ torr or is affected by subjecting the metal to a stream of bombarding ions whereby the metal or metal oxide is removed by mass transfer "sputtering".

When the above conditions are achieved, the metal is vaporized or sputtered, emitting metal vapors or atoms in all directions. These vapors or atoms impinge on the film surface, condense and thereby form a thin metallic coating on the film. Metals applicable to this process are zinc, nickel, silver, copper, gold, indium, tin, stainless steel, chromium, titanium, aluminum, oxides of such metals, and the like.

The thickness of the metal coating can depend upon the particular application and various other factors. In one embodiment, for instance, the metal layer can have a thickness of less than about 1000 angstroms, such as from about 300 to about 600 angstroms. In still other embodiments, the thickness of the metal layer may be less than about 100 angstroms.

As described above, the polyester coating of the present disclosure that is made using 2-methyl 1,3-propane diol has been found to provide improved adhesion between a metal or metal oxide layer and a base polymer film. For example, metal layers bonded to a polymer film in accordance with the present disclosure have been found to have a peel strength of greater than about 1000 g/in, such as greater than about 1300 g/in.

In addition, the coating composition has been found to have very good ink adhesion properties when an ink composition has been applied to the coating. For instance, the coating may have an ink adhesion of greater than about 300 g/in, such as greater than about 400 g/in.

In this regard, in one embodiment, the coating composition can be used in order to improve adhesion between an ink composition and a polymer film with or without the addition of a metal or metal oxide layer. For instance, in one embodiment, a polymer film can be coated with the polyester coating of the present disclosure. After the polyester coating is applied to the film, an ink composition can be printed onto the polyester coating. The ink composition can be printed onto the polyester coating so that the image, symbols, indicia or other printed matter can be viewed from the coating side of the film or can be reverse printed onto the coating so that the ink is visible from the opposite side of the film. After the ink composition is applied to the film, optionally a seal layer may be applied to the film in order to cover and enclose the ink composition. The seal layer may comprise a thermoplastic polymer or a metal or metal oxide layer. The thermoplastic polymer, for instance, may comprise a polypropylene layer, a polyethylene layer or copolymers thereof.

Films made according to the present disclosure can be used in numerous and different applications. For instance, the film may be used in packaging or as a label material. When forming metallized films, the side of the film not coated with the metal may be coated with a heat sealable material or a moisture barrier coating. The metal or metal oxide layer may also be printed with certain inks in order to form a printed package or label.

The present disclosure may be better understood with reference to the following example.

EXAMPLE 1

The following example was conducted in order to demonstrate the improved adhesion that results between a metal layer and a base polymer film when using a coating made according to the present disclosure. A PET film having a thickness of 12 microns was in-line coated with a water dispersible coating made according to the present disclosure. The water dispersible coating contained isophthalic acid and the sodium salt of 5-sulfoisophthalic acid. The mole ratio of the sulfomonomer to the isophthalic acid was 10:90.

In addition to the above, the water dispersible coating also contained 2-methyl 1,3-propane diol in a 100% mole ratio to the isophthalic acid and the sodium salt of the 5-sulfoisophthalic acid. The coating was applied to the PET film so as to have a coating thickness of approximately 0.02 microns (200 angstroms).

After the PET film was coated, stretched and dried, an aluminum layer was applied to the film. The metal layer was formed according to a vacuum deposition process.

The metallized film sample was tested by Celplast Metallized Products Limited of Toronto, Canada. Celplast conducted a metal adhesion test on the sample. The metal adhesion test was developed by Celplast and therefore is referred to as the "Celplast Test".

During the metal adhesion test, an adhesive lamination is carried out on the metal and then a 1" wide specimen of the sample is placed in a tensile testing machine, such as those available from the Instron Company. The metal layer and the base film are pulled in opposite directions until the metal layer delaminates. According to Celplast, testing is highly accurate up to 1000 grams per inch.

When the above described sample was tested, the metal adhesion was greater than 1000 grams per inch. Comparative samples made according to the process disclosed in U.S. Pat. No. 4,493,872 to Funderburk, on the other hand, typically have a metal adhesion value of from about 600 grams per inch to about 650 grams per inch.

These and other modifications and variations to the present disclosure may be practiced by those of ordinary skill in the art, without departing from the spirit and scope of the present disclosure. In addition, it should be understood that aspects of the various embodiments may be interchanged both in whole or in part. Furthermore, those of ordinary skill in the art will appreciate that the foregoing description is by way of example only, and is not intended to limit the invention.

What is claimed is:

1. A metallized film comprising:
   a polymeric film substrate having a first side and a second side, the polymeric film comprising a polyester;
   a polyester coating applied to at least the first side of the polymeric film substrate, the polyester coating comprising a polyester formed from a phthalic acid and a diol, the diol comprising 2-methyl 1,3-propane diol; and
   a metal or metal oxide layer adhered to the polyester coating.

2. A metallized film as defined in claim 1, wherein the polyester film comprises polyethylene terephthalate.

3. A metallized film as defined in claim 1, wherein the polyester coating comprises a copolyester.

4. A metallized film as defined in claim 1, wherein the phthalic acid used to form the polyester comprises isophthalic acid and wherein the polyester is further formed from a sulfomonomer containing a sulfonate group attached to a carboxylic nucleus.

5. A metallized film as defined in claim 4, wherein the sulfomonomer comprises a sodium salt of 5-sulfoisophthalic acid.

6. A metallized film as defined in claim 4, wherein the sulfomonomer is present with respect to isophthalic acid in a mole ratio of from about 8:92 to about 12:88.

7. A metallized film as defined in claim 1, wherein the polyester coating has a thickness of less than about 0.3 microns.

8. A metallized film as defined in claim 1, wherein the metal or metal oxide layer comprises a metal selected from the group consisting of zinc, nickel, silver, copper, gold, indium, tin, iron, chromium, titanium and aluminum.

9. A metallized film as defined in claim 1, wherein the metal or metal oxide layer comprises aluminum.

10. A metallized film as defined in claim 1, wherein the metal or metal oxide layer has a peel strength on the polymeric film of greater than about 1000 g/in.

11. A metallized film as defined in claim 1, wherein an ink composition has been applied to the polyester coating prior to adhering the polyester coating to a metal or metal oxide layer.

12. A metallized film comprising:
a polymeric film substrate having a first side and a second side, the polymeric film comprising a polyester;
a copolyester coating applied to at least the first side of the polymer film substrate, the copolyester coating comprising a copolyester formed from components including isophthalic acid, a sulfomonomer containing a sulfonate group attached to a dicarboxylic nucleus, and a diol, the diol comprising 2-methyl 1,3-propane diol; and
a metal layer or metal oxide layer adhered to the copolyester coating.

13. A metallized film as defined in claim 12, wherein the polyester film comprises polyethylene terephthalate.

14. A metallized film as defined in claim 13, wherein the metal or metal oxide layer comprises aluminum.

15. A metallized film as defined in claim 12, wherein the sulfomonomer comprises a sodium salt of 5-sulfoisophthalic acid.

16. A metallized film as defined in claim 12, wherein the sulfomonomer is present with respect to isophthalic acid in a mole ratio of from about 8:92 to about 12:88.

17. A metallized film as defined in claim 12, wherein the copolyester coating has a thickness of less than about 0.3 microns.

18. A metallized film as defined in claim 12, wherein the metal or metal oxide layer comprises a metal selected from the group consisting of zinc, nickel, silver, copper, gold, indium, tin, iron, chromium, titanium and aluminum.

19. A metallized film as defined in claim 12, wherein the metal or metal oxide layer has a peel strength on the polymeric film of greater than about 1000 gun.

20. A metallized film as defined in claim 12, wherein an ink composition has been applied to the copolyester coating prior to adhering the copolyester coating to the metal or metal oxide layer.

21. A process for adhering a metallized film layer to a polymer film comprising:

coating a surface of a polymer film comprising polyester with a copolyester coating, the polymer film comprising a polyester film or a polyamide film, the copolyester coating comprising a copolyester formed of components including isophthalic acid, a sulfomonomer containing a sulfonate group attached to a dicarboxylic nucleus, and a diol, the diol comprising 2-methyl 1,3-propane diol; and forming a metallized layer on a surface of the copolyester coating, the metallized layer comprising aluminum, the metallized layer being formed from a metal vapor.

22. A film comprising:
a polymeric film substrate having a first side and a second side, the polymeric film substrate comprising a polyester;
a copolyester coating applied to at least the first side of the polymer film substrate, the copolyester coating comprising a copolyester formed from components including isophthalic acid, a sulfomonomer containing a sulfonate group attached to a dicarboxylic nucleus and a diol, the diol comprising 2-methyl 1,3-propane diol, the copolyester coating having a thickness of less than about 0.3 microns; and
an ink composition applied to the copolyester coating.

23. A film as defined in claim 22, further comprising a seal layer covering the ink composition.

24. A film as defined in claim 23, wherein the seal layer comprises a metal or metal oxide.

25. A film as defined in claim 22, wherein the copolyester coating has an ink adhesion of greater than about 300 gun.

26. A film as defined in claim 22, wherein the copolyester coating has an ink adhesion of greater than about 400 gun.

27. A film comprising:
a polymeric film substrate having a first side and a second side, the polymeric film substrate comprising a polyester;
a copolyester coating applied to at least the first side of the polymer film substrate, the copolyester coating comprising a copolyester formed from components including isophthalic acid, a sulfomonomer containing a sulfonate group attached to a dicarboxylic nucleus and a diol, the diol comprising 2-methyl 1,3-propane diol, the copolyester coating having a thickness of less than about 0.3 microns.

* * * * *

UNITED STATES PATENT AND TRADEMARK OFFICE
CERTIFICATE OF CORRECTION

PATENT NO. : 7,427,435 B2  Page 1 of 1
APPLICATION NO. : 11/493867
DATED : September 23, 2008
INVENTOR(S) : Robert Giles Posey It is certified that error appears in the above-identified patent and that said Letters Patent is hereby corrected as shown below:

Column 9, line 39, after the number 1000, please delete --gun-- and insert "g/in"

Column 10, line 30, after the number 300, please delete --gun-- and insert "g/in"

Column 10, line 32, after the number 400, please delete --gun-- and insert "g/in"

Signed and Sealed this

Third Day of March, 2009

JOHN DOLL
*Acting Director of the United States Patent and Trademark Office*